(12) United States Patent
Chou et al.

(10) Patent No.: US 9,824,985 B2
(45) Date of Patent: Nov. 21, 2017

(54) SEMICONDUCTOR DEVICE AND SEMICONDUCTOR SYSTEM

(71) Applicant: Taiwan Semiconductor Manufacturing Co., Ltd, Hsin-Chu (TW)

(72) Inventors: Shuo-Chun Chou, Hsinchu (TW); Chi-Feng Huang, Zhubei (TW); Chia-Chung Chen, Keelung (TW); Victor Chiang Liang, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/801,036

(22) Filed: Jul. 16, 2015

(65) Prior Publication Data

US 2017/0018511 A1   Jan. 19, 2017

(51) Int. Cl.
*H01L 23/00* (2006.01)
*H01L 23/58* (2006.01)
*H01L 23/522* (2006.01)

(52) U.S. Cl.
CPC ........ *H01L 23/585* (2013.01); *H01L 23/5225* (2013.01)

(58) Field of Classification Search
CPC ..................................................... H01L 23/585
See application file for complete search history.

(56) References Cited

U.S. PATENT DOCUMENTS

| | | | |
|---|---|---|---|
| 7,265,438 B2 | 9/2007 | Tsai et al. | |
| 7,893,459 B2 | 2/2011 | Wang et al. | |
| 7,898,056 B1* | 3/2011 | Keramat | H01L 23/564 257/170 |
| 8,242,586 B2 | 8/2012 | Chang et al. | |
| 2011/0108945 A1 | 5/2011 | Wang et al. | |
| 2015/0333019 A1* | 11/2015 | Lee | H01L 23/66 257/508 |

\* cited by examiner

*Primary Examiner* — William Harriston
(74) *Attorney, Agent, or Firm* — McClure, Qualey & Rodack, LLP

(57) ABSTRACT

A semiconductor device is provided. The semiconductor device includes a seal ring and a noise-absorbing circuit. The noise-absorbing circuit is electrically connected between the seal ring and a ground pad. The noise-absorbing circuit includes at least one capacitor and at least one inductor to form a first noise-absorbing path, a second noise-absorbing path and a third noise-absorbing path.

20 Claims, 9 Drawing Sheets

SEMICONDUCTOR DEVICE AND SEMICONDUCTOR SYSTEM

BACKGROUND

This present disclosure relates to semiconductor devices, and more specifically to semiconductor devices with seal ring structures.

Mixed-signal integrated circuits (IC) which include digital blocks and analog/radio frequency (RF) blocks in a single semiconductor die are widely used. As IC speed increases, seal rings have been incorporated into the semiconductor die in order to reduce RF interference and signal cross coupling. However, the analog/RF block is more sensitive to interference from noise that is generated by other blocks and coupled via the seal ring. Therefore, there is a need to enhance the noise immunity of the noise-sensitive blocks.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
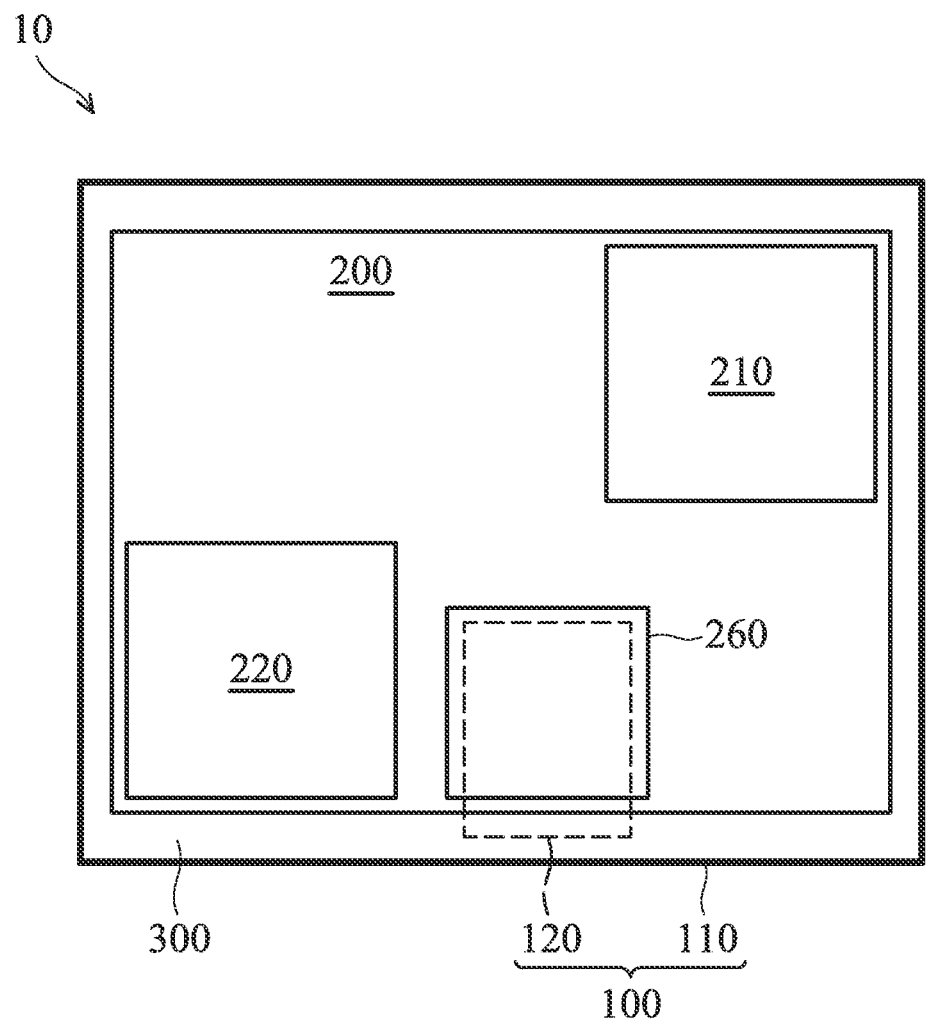
FIG. 1 is a top view illustrating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure provides a semiconductor device that has a seal ring and a noise-absorbing circuit connected between the seal ring and the ground pad. The noise-absorbing circuit includes at least one inductor and at least one capacitor in order to provide at least one noise-absorbing path. Based on the experimental result, this disclosure provides better noise immunity at a wider frequency band due to the noise-absorbing path compared with the typical seal ring.

Because the capacitor and the inductor are mainly arranged below the ground pad, less area penalty and more flexible implementation are provided by the semiconductor device of the disclosure. In addition, the disclosure does not limit the number of inductors and capacitors. The number and arrangement of the inductor and capacitor could be determined by the noise frequency and the quality factor. Moreover, placing the series inductor and capacitor near the noise-sensitive component may provide the same benefit as well.

FIG. 1 is a top view illustrating a semiconductor device 100 in accordance with some embodiments. As shown in FIG. 1, the semiconductor system 10 includes a semiconductor device 100 and the main circuit 200. The semiconductor device 100 includes a seal ring 110 and a noise-absorbing circuit 120. The main circuit 200 includes a noisy circuit 210, a noise-sensitive circuit 220 and a ground pad 260. More specifically, the noisy circuit 210 could be a digital circuit, and the noise-sensitive circuit 220 could be an analog/RF circuit. In other embodiments, other circuits and electronic components could also be included by the main circuit 200.

In addition, the main circuit 200 is encircled by the seal ring 110, and an assembly isolation region 300 is arranged between the seal ring 110 and the main circuit 200 as a buffer region. Specifically, the seal ring 110 surrounds the main circuit 200 including the noisy circuit 210 and the noise-sensitive circuit 220. The seal ring 110 is utilized to prevent the main circuit 200 from being damaged.

Figure 2A:
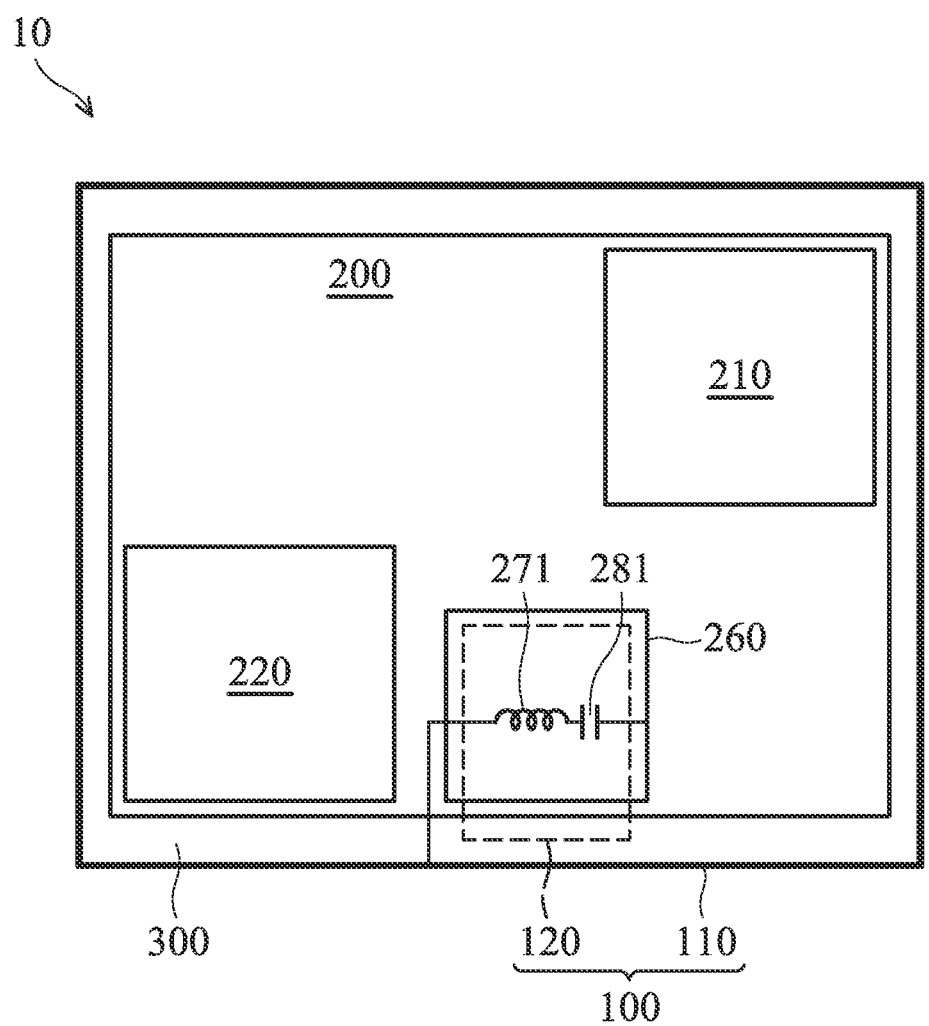
FIGS. 2A-2C are top views illustrating the semiconductor device in accordance with some embodiments.

In some embodiments, the noise-absorbing circuit 120 includes at least one capacitor and at least one inductor, and the noise-absorbing circuit is mainly arranged below the ground pad 260. FIG. 2A is a top view illustrating the semiconductor device 100 in accordance with some embodiments. As shown in FIG. 2A, the noise-absorbing circuit 120 includes the inductor 271 and the capacitor 281 arranged in series. The inductor 271 and the capacitor 281 are connected between the ground pad 260 and seal ring 110.

It should be noted the inductor 271 and the capacitor 281 are arranged directly below the ground pad 260. The ground pad 260 directly covers the inductor 271 and the capacitor 281. If the inductor 271 and the capacitor 281 are arranged on the assembly isolation region 300, some area will be occupied and the size of the semiconductor system 10 could increase accordingly. Since the ground pad 260 has been originally arranged for the main circuit 200, the method of arranging the inductor 271 and the capacitor 281 below the ground pad 260 provides less area penalty and more flexible implementation.

Figure 2B:
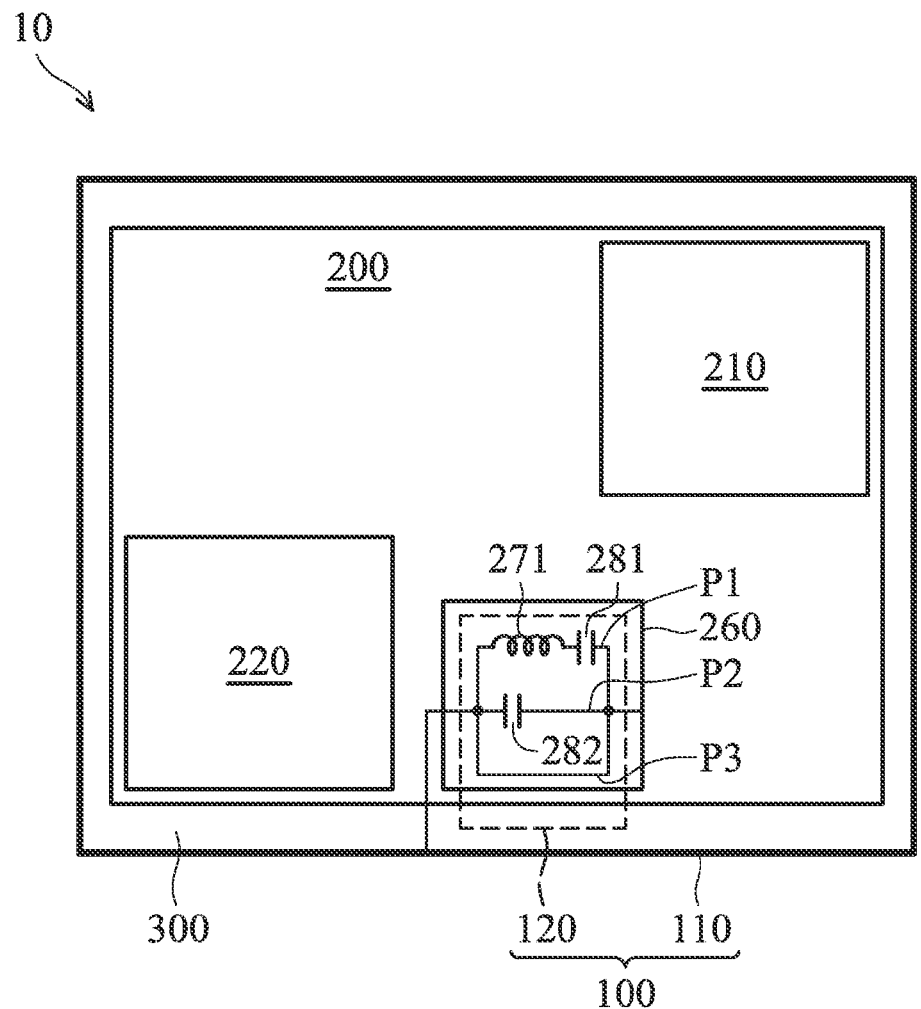

FIG. 2B is another top view illustrating the semiconductor device 100 in accordance with some embodiments. The noise-absorbing circuit 120 further includes the capacitor 282. The capacitor 282 is also directly arranged below the ground pad 260. In this embodiment, the noise-absorbing circuit 120 includes the inductor 271 and the capacitor 281 to form a first noise-absorbing path P1, and the capacitor 282 to form a second noise-absorbing path P2. The first noise-absorbing path P1 and the second noise-absorbing path P2 are utilized to absorb interfering noise generated by the noisy circuit 210.

Furthermore, a third noise-absorbing path P3 is electrically short without arranging any electronic components between the ground pad 260 and the seal ring 110. The third noise-absorbing path P3 is electrically connected between the ground pad 260 and the seal ring 110, and is utilized to further absorb interfering noise generated by the noisy circuit 210. In other words, three different noise-absorbing paths P1, P2 and P3 are provided by the noise-absorbing circuit 120. As shown in FIG. 2B, the first noise-absorbing path P1, the second noise-absorbing path P2 and the third noise-absorbing path P3 are arranged in parallel.

Since the three noise-absorbing paths P1, P2 and P3 are connected to the ground pad 260, they are low-impedance paths. Accordingly, when the interfering noise is generated by the noisy circuit 210 and transmitted along the seal ring 110, the interfering noise would pass through the noise-absorbing circuit 120 due to their low-impedance paths. Afterwards, the interfering noise will be expelled to the ground pad 260. In other words, the interfering noise will be absorbed by the noise-absorbing circuit 120.

In the embodiment as shown in FIG. 2B, the noise-absorbing circuit 120 is arranged near the noise-sensitive circuit 220 to prevent the noise-sensitive circuit 220 from being disturbed by the noise. However, the position of the noise-absorbing circuits 120 may be adjusted in association with the ground pad 260. For example, the noise-absorbing circuit 120 may be arranged between the noisy circuit 210 and the noise-sensitive circuit 220. In addition, the number of the noise-absorbing circuits 120 may be changed. In one embodiment, the semiconductor device may include two noise-absorbing circuits, and the noise-sensitive circuit 220 is arranged between the two noise-absorbing circuits.

More specifically, the impedance of the first noise-absorbing path P1 is illustrated as below:

$$Z = j \cdot \omega \cdot L + \frac{1}{j \cdot \omega \cdot C}$$

The impedance of the second noise-absorbing path P2 is illustrated as below:

$$Z = \frac{1}{j \cdot \omega \cdot C}$$

The impedance of the third noise-absorbing path P3 is illustrated as below:

$$Z = j \cdot \omega \cdot L$$

It should be noted that, in order to lower the impedance of the noise-absorbing path, the size, material and the structure of the capacitor and inductor could be adjusted. In addition, other electronic components such as resistances, capacitors and inductors could be added in order to obtain the impedance which is suitable for the semiconductor device 100.

In some embodiments, the first noise-absorbing path P1 which is formed by the inductor 271 and the capacitor 281 is utilized for absorbing middle-frequency noise. The second noise-absorbing path P2 which is formed by the capacitor 282 is utilized for absorbing high-frequency noise, and the third noise-absorbing path P3 is utilized for absorbing low-frequency noise. Therefore, the semiconductor device 100 of the disclosure provides good noise immunity at a wide frequency range rather than a specific frequency. By utilizing the semiconductor device 100 of the disclosure, the noise-sensitive circuit 220 could be prevented from being interfered with and disturbed by the noise of various frequencies.

Figure 2C:
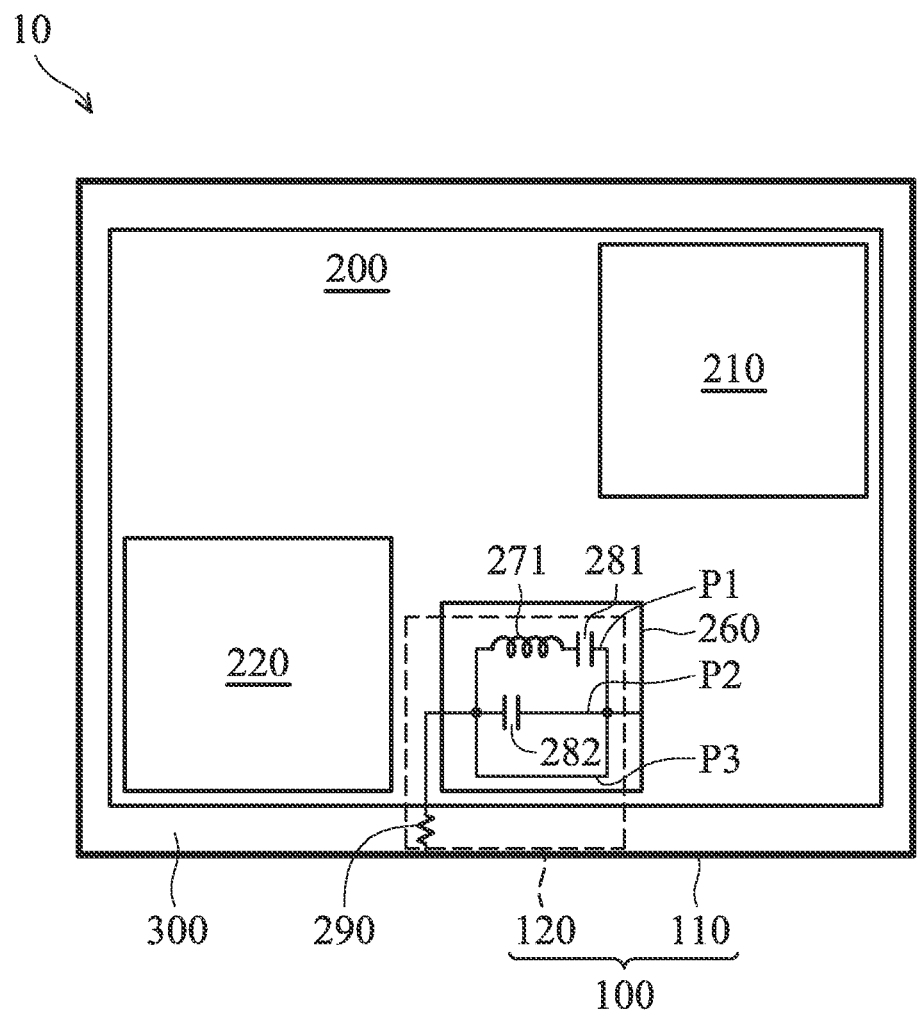

FIG. 2C is another top view illustrating the semiconductor device 100 in accordance with some embodiments. The noise-absorbing circuit 120 further includes a resistor 290. The resistor 290 is arranged in the assembly isolation region 300 and in series with the three noise-absorbing paths. In this embodiment, most electronic components of the noise-absorbing circuit 120 are arranged below the ground pad 260, and few electronic components of the noise-absorbing circuit 120 are arranged in the assembly isolation region 300. Therefore, less area penalty and more flexible implementation are provided by the noise-absorbing circuit 120.

It should be noted that arrangement of the resistor 290 is for illustration, not for limitation. For example, the resistor 290 could be arranged between the inductor 271 and the capacitor 281. The number and the arrangement of the electronic components could be adjusted according to the noise frequency and the quality factor of the semiconductor system 10.

Figure 3A:
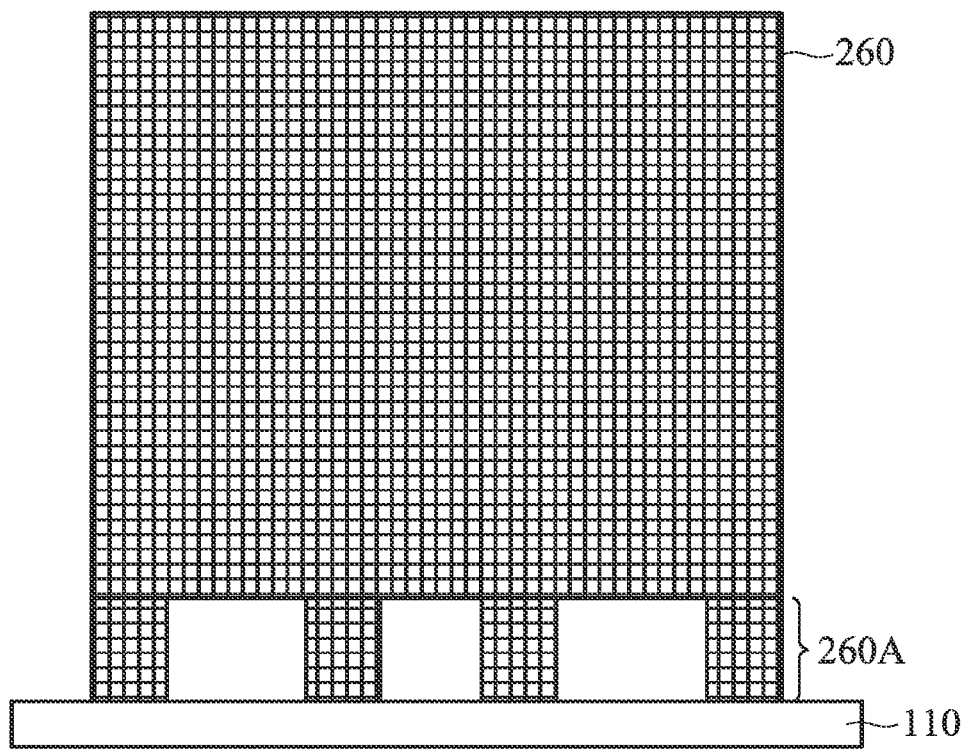
FIG. 3A is a top view illustrating a ground pad in accordance with some embodiments.

FIG. 3A is a top view illustrating the ground pad 260 in accordance with some embodiments. In this embodiment, the ground pad 260 includes a number of contacts 260A to directly connect the seal ring 110. Therefore, an electrically short path (the third noise-absorbing path P3) is provided, and the third noise-absorbing path P3 is mainly arranged within the ground pad 260. It should be noted that the impedance could be lowered by decreasing the distance between the ground pad 260 and the seal ring 110.

Figure 3B:
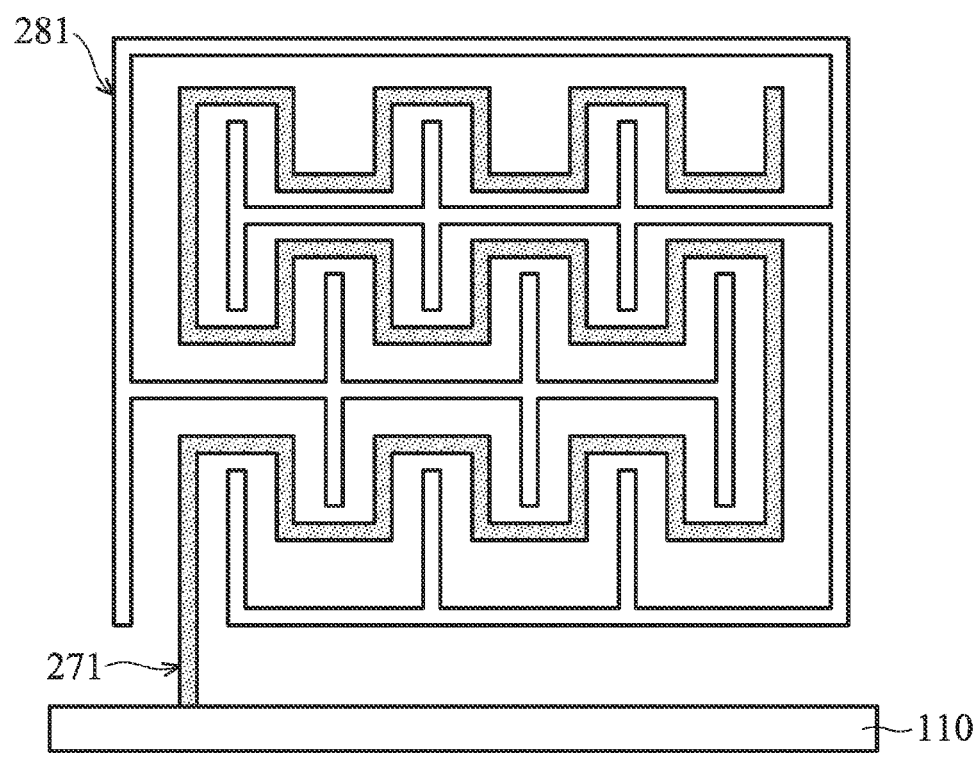
FIG. 3B is a top view illustrating a capacitor and an inductor of a noise-absorbing circuit in accordance with some embodiments.

FIG. 3B is a top view illustrating the capacitor 281 and the inductor 271 of the first noise-absorbing path P1 of the noise-absorbing circuit 120 in accordance with some embodiments. In accordance with the embodiment as shown in FIG. 2B, the inductor 271 directly connects to the seal ring 110. The inductor and the capacitor could be configured with various kinds of structure such as spiral structures, meander structures and helical structures.

Figure 3C:
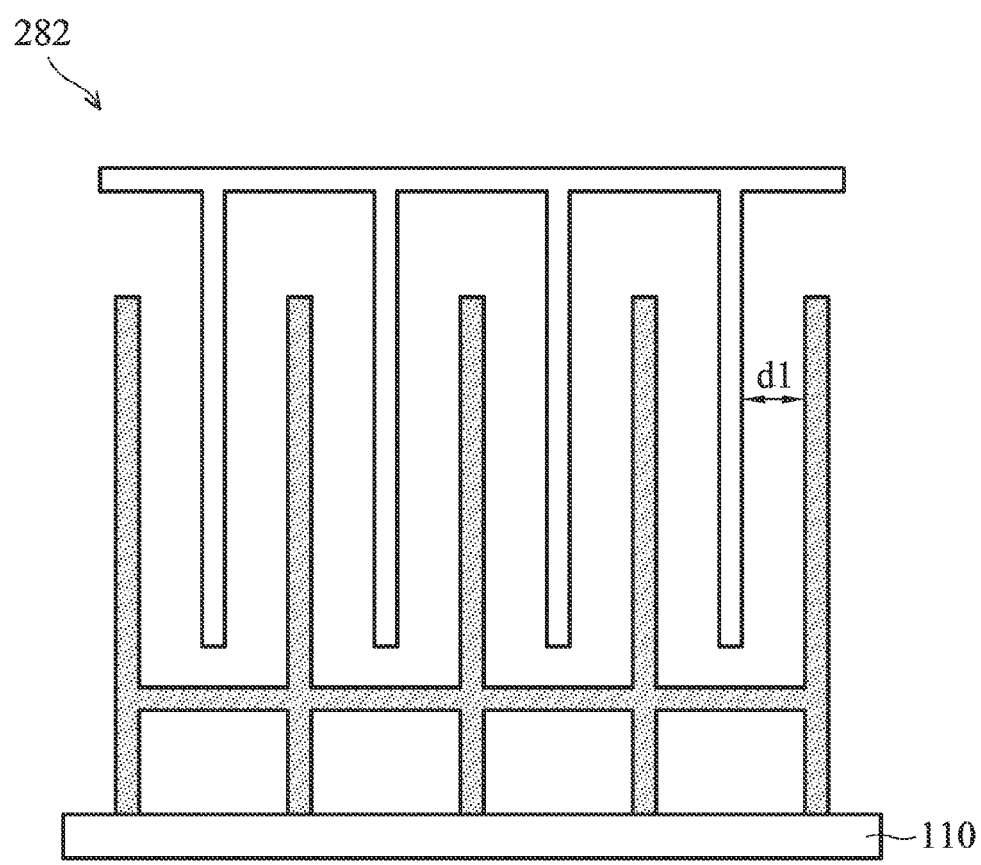
FIG. 3C is a top view illustrating a capacitor of a noise-absorbing circuit in accordance with some embodiments.

FIG. 3C is a top view illustrating the capacitor 282 of the second noise-absorbing path P2 of the noise-absorbing circuit 120 in accordance with some embodiments. The capacitor 282 may be configured as a metal-oxide-metal (MOM) capacitor or a metal-insulator-metal (MIM) capacitor. The MOM capacitor may be a multi-finger capacitor formed by multiple metal layers in the vertical BEOL (back-end-of-line) stack separated by inter-metal dielectrics. The MIM capacitor may be a parallel-plate capacitor formed by two planes of metal separated by a thin high-K dielectric.

In some embodiments, the first noise-absorbing path P1 and the second noise-absorbing path P2 are mainly arranged in different layers below the ground pad 260. More specifically, the ground pad 260 includes the third noise-absorbing path P3. The layer including the inductor 271 and the capacitor 281 of the first noise-absorbing path P1 is arranged directly below the ground pad 260. In other words, the layer of the ground pad 260 directly covers the layer of the inductor 271 and the capacitor 281. Furthermore, the layer including the capacitor 282 of the second noise-absorbing path P2 is arranged directly below the layer of the first noise-absorbing path P1. In other words, the layer of the inductor 271 and the capacitor 281 directly covers the layer of the capacitor 282.

In another embodiment, the layer including the capacitor 282 of the second noise-absorbing path P2 is arranged below the ground pad 260 including the third noise-absorbing path P3. In other words, the layer of the ground pad 260 directly covers the layer of the capacitor 282. Furthermore, the layer including the inductor 271 and the capacitor 281 of the first noise-absorbing path P1 is arranged below the layer of the second noise-absorbing path P2. In other words, the layer of the capacitor 282 directly covers the layer of the inductor 271 and the capacitor 281.

It should be noted that the areas of the layer of the capacitor 282, the layer of the inductor 271 and the capacitor 281, and the layer of the ground pad 260 are approximately the same. The layer of the capacitor 282 and the layer of the inductor 271 and the capacitor 281 are directly below the layer of the ground pad 260. Therefore, the region of the noise-absorbing circuit 120 is mainly within the region of the ground pad. Additional areas or additional regions will be not occupied by the noise-absorbing circuit 120 for the main circuit 200.

In addition, as shown in FIG. 3C, the two metals are separated by a distance d1. Because the first noise-absorbing path P1 and the second noise-absorbing path P2 are mainly arranged in different layers below the ground pad 260, they have a similar area as the ground pad 260. Therefore, the square area may not be altered for the capacitor 282 due to the ground pad 260. However, the distance d1 can be increased or decreased to adjust the capacitance value of the capacitor 282.

Figure 4:
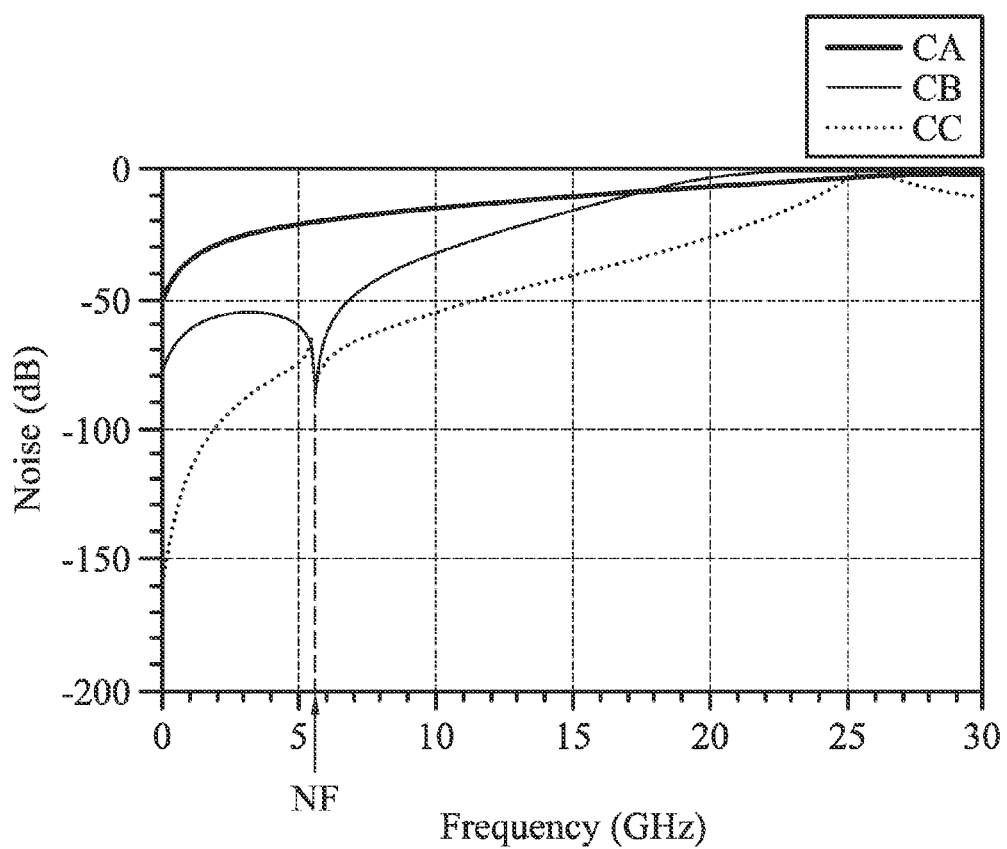
FIG. 4 is a diagram illustrating noise and frequency in accordance with some embodiments.

FIG. 4 is a diagram illustrating noise and frequency in accordance with some embodiments. The curve CA corresponds to the embodiment with a typical seal ring, the curve CB corresponds to the embodiment with the semiconductor device 100 as shown in FIG. 2A, and the curve CC corresponds to the embodiment with the semiconductor device 100 as shown in FIG. 2B. As shown in FIG. 4, regarding the curve CA, the noise for the noise-sensitive circuit 220 is more than −50 dB in all frequencies. Compared with the curve CA, lower noise is displayed in the curve CB when the frequency is lower than about 17.5 HGz. The noise below the frequency of 17.5 GHz is absorbed by the noise-absorbing circuit 120. However, as shown in the curve CB of FIG. 4, the noise is not further decreased in high frequencies. The noise-sensitive circuit 220 still suffers from interference from the high-frequency noise.

As shown in FIG. 4, the curve CC displays that the noise is decreased and lower than the curves CA and CB for almost all frequencies. This is because three noise-absorbing paths P1, P2 and P3 are provided in the embodiment of FIG. 2B. The low-frequency band, the middle-frequency band and the high-frequency band are covered by the three noise-absorbing paths P1, P2 and P3 of the semiconductor device 100 of the disclosure. Furthermore, as shown in FIG. 4, the noise abruptly drops in the notch frequency NF. In some embodiments, the notch frequency can be determined by adjusting the values and arrangements of the electronic components of the noise-absorbing circuit 120.

Figure 5:
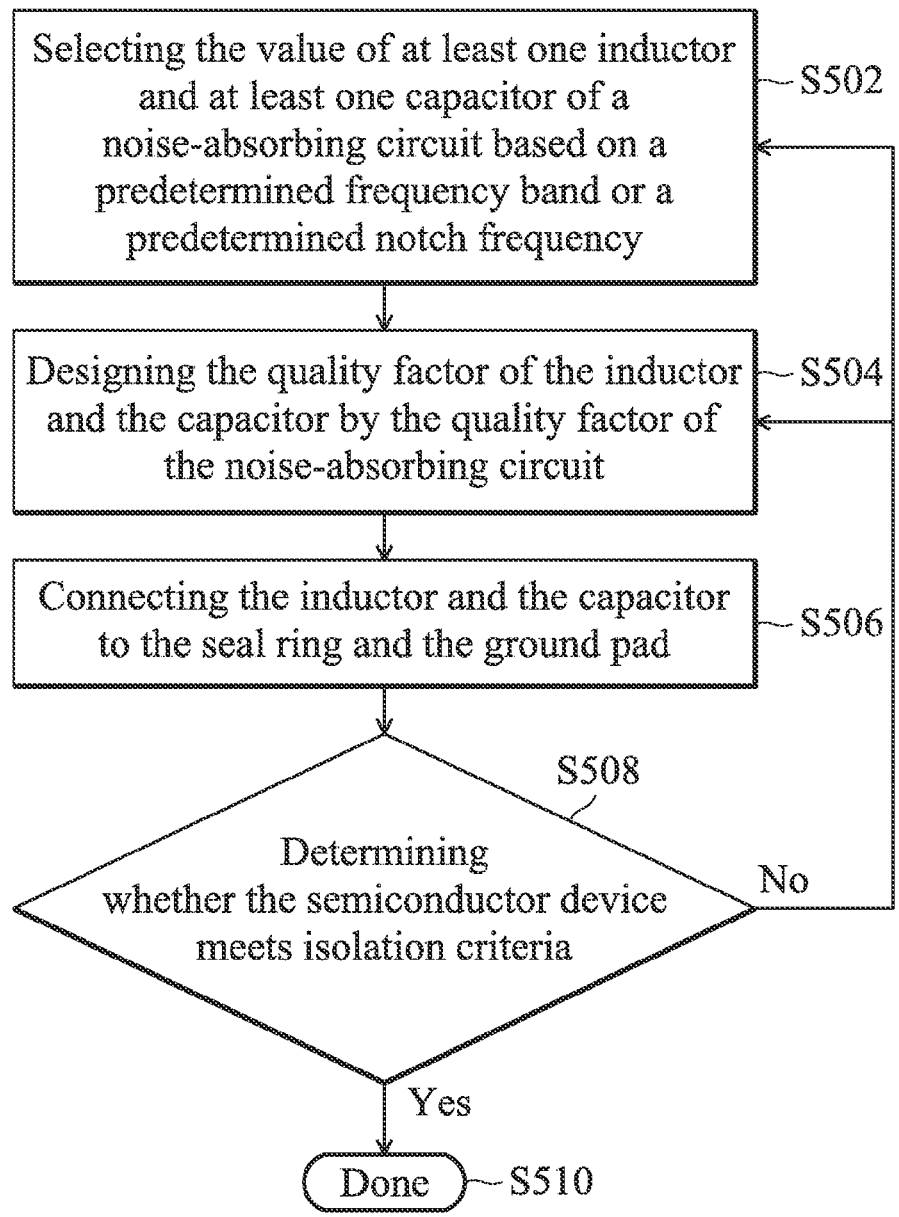
FIG. 5 is a flow chart for fabricating a semiconductor device in accordance with some embodiments.

FIG. 5 is a flow chart for fabricating a semiconductor device 100 in accordance with some embodiments. In step S502, the values of at least one inductor and at least one capacitor of a noise-absorbing circuit 120 are selected based on a predetermined frequency band or a predetermined notch frequency. In step S504, the quality factor of the inductor and the capacitor is designed by the quality factor of the noise-absorbing circuit 120. Afterwards, the inductor and the capacitor are connected to the seal ring 110 and the ground pad 260 as shown in step S506. The inductors and the capacitors can be arranged with various types to form a number of noise-absorbing paths for a wide frequency band of noise.

Afterwards, in step S508, it is determined whether the semiconductor device 100 meets the isolation criteria or not. If the semiconductor device 100 meets the isolation criteria, the fabricating process of the semiconductor device 100 is finished. If the semiconductor device 100 does not meet the isolation criteria, step S502 will be executed again in order to re-select the values of the capacitor and the inductor, or step S504 will be executed again to re-determine the quality factor.

The semiconductor device 100 including a seal ring 110 and a noise-absorbing circuit 120 is provided. The noise-absorbing circuit 120 is connected between the seal ring 110 and the ground pad 260, and it includes at least one inductor and at least one capacitor in order to provide at least one noise-absorbing path. Because the ground pad 260 has been originally arranged for the main circuit 200, the method of arranging the inductor and the capacitor below the ground pad 260 provides less area penalty and more flexible implementation.

In addition, a number of noise-absorbing paths could be provided by the capacitors and inductors for absorbing noise of different frequencies. Therefore, the semiconductor device 100 of the disclosure provides good noise immunity at a wide frequency range. By utilizing the semiconductor device 100 of the disclosure, the noise-sensitive circuit 220 could be prevented from being interfered with and disturbed by the noise of various frequencies. Based on the experimental results shown in FIG. 4, this disclosure provides better noise immunity at a wider frequency band due to the noise-absorbing path compared with the typical seal ring.

According to an exemplary embodiment, a semiconductor device is provided. The semiconductor device includes a seal ring and a noise-absorbing circuit. The noise-absorbing circuit is electrically connected between the seal ring and a ground pad. The noise-absorbing circuit includes at least one capacitor and at least one inductor.

According to an exemplary embodiment, a semiconductor device is provided. The semiconductor device includes a seal ring and a noise-absorbing circuit. The noise-absorbing circuit is electrically connected between the seal ring and a ground pad. The noise-absorbing circuit includes at least one capacitor and at least one inductor to form the first noise-absorbing path, a second noise-absorbing path and a third noise-absorbing path.

According to an exemplary embodiment, a method for fabricating a semiconductor device is provided. The method includes the following operations: selecting the value of at least one inductor and at least one capacitor of a noise-absorbing circuit based on a predetermined frequency band or a predetermined notch frequency; designing the quality factor of the inductor and the capacitor by the quality factor of the noise-absorbing circuit; connecting the inductor and the capacitor to the seal ring and the ground pad and determining whether the semiconductor device meets isolation criteria.

According to an exemplary embodiment, a semiconductor system is provided. The semiconductor system includes a main circuit, a seal ring, and a noise-absorbing circuit. The seal ring encircles the main circuit. The noise-absorbing circuit is electrically connected between the seal ring and a ground pad. The noise-absorbing circuit includes at least one capacitor and at least one inductor. The ground pad covers the at least one capacitor and the at least one inductor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a ground pad;
   a seal ring, encircling the ground pad; and
   a noise-absorbing circuit electrically connected between the seal ring and the ground pad, wherein the noise-absorbing circuit comprises at least one capacitor and at least one inductor directly below the ground pad.

2. The semiconductor device as claimed in claim 1, wherein the at least one capacitor comprises a first capacitor and a second capacitor, the at least one inductor comprises a first inductor, the first capacitor and the first inductor are connected in series to form a first noise-absorbing path of the noise-absorbing circuit, and the second capacitor forms a second noise-absorbing path of the noise-absorbing circuit.

3. The semiconductor device as claimed in claim 2, wherein the noise-absorbing circuit further comprises a third noise-absorbing path which is electrically short between the ground pad and the seal ring.

4. The semiconductor device as claimed in claim 3, wherein the first noise-absorbing path, the second noise-absorbing path and the third noise-absorbing path are arranged in parallel.

5. The semiconductor device as claimed in claim 3, wherein the first noise-absorbing path is utilized for absorbing middle-frequency noise, the second noise-absorbing path is utilized for absorbing high-frequency noise, and the third noise-absorbing path is utilized for absorbing low-frequency noise.

6. The semiconductor device as claimed in claim 3, wherein the first noise-absorbing path and the second noise-absorbing path are mainly arranged in different layers below the ground pad, and the third noise-absorbing path is mainly arranged within the ground pad.

7. The semiconductor device as claimed in claim 1, wherein the seal ring encircles the noise-absorbing circuit and a main circuit which comprises a noisy circuit and a noise-sensitive circuit, and the noise-absorbing circuit is arranged near the noise-sensitive circuit.

8. The semiconductor device as claimed in claim 7, wherein an assembly isolation region is arranged between the main circuit and the seal ring, and another portion of the at least one capacitor and the at least one inductor which are not arranged below the ground pad are arranged on the assembly isolation region.

9. The semiconductor device as claimed in claim 1, wherein the ground pad is completely encircled by the seal ring in a plan view.

10. A semiconductor device, comprising:
    a ground pad;
    a seal ring, encircling the ground pad; and
    a noise-absorbing circuit electrically connected between the seal ring and the ground pad, wherein the noise-absorbing circuit comprises at least one capacitor and at least one inductor directly below the ground pad to form a first noise-absorbing path, a second noise-absorbing path and a third noise-absorbing path.

11. The semiconductor device as claimed in claim 10, wherein the at least one capacitor comprises a first capacitor and a second capacitor, the at least one inductor comprises a first inductor, the first capacitor and the first inductor are connected in series to form the first noise-absorbing path of the noise-absorbing circuit, and the second capacitor forms the second noise-absorbing path of the noise-absorbing circuit.

12. The semiconductor device as claimed in claim 11, wherein the third noise-absorbing path is electrically short between the ground pad and the seal ring.

13. The semiconductor device as claimed in claim 12, wherein the first noise-absorbing path, the second noise-absorbing path and the third noise-absorbing path are arranged in parallel.

14. The semiconductor device as claimed in claim 12, wherein the first noise-absorbing path is utilized for absorbing middle-frequency noise, the second noise-absorbing path is utilized for absorbing high-frequency noise, and the third noise-absorbing path is utilized for absorbing low-frequency noise.

15. The semiconductor device as claimed in claim 12, wherein the first noise-absorbing path and the second noise-absorbing path are mainly arranged in different layers below the ground pad, and the third noise-absorbing path is mainly arranged within the ground pad.

16. The semiconductor device as claimed in claim 10, wherein the seal ring encircles the noise-absorbing circuit and a main circuit which comprises a noisy circuit and a noise-sensitive circuit, and the noise-absorbing circuit is arranged near the noise-sensitive circuit.

17. The semiconductor device as claimed in claim 16, wherein an assembly isolation region is arranged between the main circuit and the seal ring, and another portion of the at least one capacitor and the at least one inductor which are not arranged below the ground pad are arranged on the assembly isolation region.

18. A semiconductor system, comprising:
    a ground pad;
    a main circuit;
    a seal ring, encircling the main circuit and the ground pad; and
    a noise-absorbing circuit electrically connected between the seal ring and the ground pad, wherein the noise-absorbing circuit comprises at least one capacitor and at least one inductor, and the ground pad covers the at least one capacitor and at least one inductor.

19. The semiconductor system as claimed in claim 18, wherein the at least one capacitor comprises a first capacitor and a second capacitor, the at least one inductor comprises a first inductor, the first capacitor and the first inductor are connected in series to form a first noise-absorbing path of the noise-absorbing circuit, the second capacitor forms a second noise-absorbing path of the noise-absorbing circuit, and a third noise-absorbing path is electrically short between the ground pad and the seal ring.

20. The semiconductor system as claimed in claim 18, wherein an assembly isolation region is arranged between the main circuit and the seal ring, and another portion of the at least one capacitor and the at least one inductor which are not arranged below the ground pad are arranged on the assembly isolation region.

\* \* \* \* \*